United States Patent [19]
Balzer et al.

[11] Patent Number: 5,858,254
[45] Date of Patent: Jan. 12, 1999

[54] MULTILAYERED CIRCUITIZED SUBSTRATE AND METHOD OF FABRICATION

[75] Inventors: Peter Lynn Balzer, Chenango Forks; Robert Lee Lewis, Apalachin; Robert David Sebesta, Endicott, all of N.Y.

[73] Assignee: International Business Machines Corporation, Armonk, N.Y.

[21] Appl. No.: 789,813

[22] Filed: Jan. 28, 1997

[51] Int. Cl.⁶ .................................................. C23F 1/00
[52] U.S. Cl. ............................ 216/2; 216/52; 430/311; 437/51; 437/195; 437/208; 437/225
[58] Field of Search ........................ 216/2, 52; 437/51, 437/195, 225, 208; 430/311

[56] References Cited

U.S. PATENT DOCUMENTS

| | | | |
|---|---|---|---|
| 4,536,951 | 8/1985 | Rhodes et al. | 29/589 |
| 4,622,058 | 11/1986 | Leary-Renick et al. | 65/105 |
| 4,737,838 | 4/1988 | Watanabe | 357/51 |
| 4,769,269 | 9/1988 | Johnson et al. | 428/131 |
| 4,921,777 | 5/1990 | Fraenkel et al. | 430/314 |
| 4,995,941 | 2/1991 | Nelson et al. | 156/630 |
| 5,221,426 | 6/1993 | Tessier et al. | 156/643 |
| 5,329,695 | 7/1994 | Traskos et al. | 29/830 |
| 5,337,466 | 8/1994 | Ishida | 29/830 |
| 5,372,666 | 12/1994 | Kawasaki | 156/89 |
| 5,382,447 | 1/1995 | Kaja et al. | 427/126.6 |
| 5,510,294 | 4/1996 | Dixit et al. | 437/195 |
| 5,593,921 | 1/1997 | Chen et al. | 437/195 |
| 5,610,100 | 3/1997 | Kurino et al. | 437/195 |
| 5,612,573 | 3/1997 | Lewis et al. | 257/758 |
| 5,712,192 | 1/1998 | Lewis et al. | 437/182 |

*Primary Examiner*—Christopher L. Chin
*Attorney, Agent, or Firm*—Heslin & Rothenberg, P.C.

[57] ABSTRACT

A multilayer circuit fabrication approach and circuitized substrate are presented wherein at least two conductive layers are formed over a substrate. The conductive layers are separated by a first dielectric layer and the structure is encapsulated with a second dielectric layer. The first dielectric layer includes open areas exposing a portion of the underlying support structure aligned to those areas where contact points are to reside in the second conductive layer. The first dielectric layer comprises a blanket dielectric layer such that recesses are defined in the upper surface thereof aligned to the open areas of the first conductive layer. The second conductive layer thus resides in two planes, both of which comprise planes other than a plane of the first conductive layer. A plurality of openings can be simultaneously formed to expose contact points in both the first and second conductive layers.

20 Claims, 2 Drawing Sheets

MULTILAYERED CIRCUITIZED SUBSTRATE AND METHOD OF FABRICATION

TECHNICAL FIELD

This invention relates in general to fabrication of multilayer circuits over a support substrate, an integrated circuit chip or a printed circuit board, and more particularly, to a method of fabrication which employs in part simultaneous laser ablation of dielectric layers to expose selected portions of multiple conductive layers and to a multilayer circuit wherein a second conductive layer resides on two different levels with contact pads therein recessed towards a first conductive layer.

BACKGROUND OF THE INVENTION

Multilayer circuits are well known and are typically fabricated by providing a first conductive layer over a substrate, covering the first conductive layer with a dielectric blanket, then providing a second conductive layer over the dielectric blanket. The second conductive layer is circuitized with two photolithographic and wet etching process steps. A first photo pass provides "personality", where circuitry is defined, while a second photo pass is a "select" pass where solderable locations are defined. Vias in the dielectric blanket may be formed either prior to formation of the second conductive layer or after the personality of the second conductive layer is defined.

By way of more specific example, an existing process for producing a circuitized substrate designed to receive an integrated circuit chip might include circuitizing a first metal layer over a substrate, applying a dielectric layer over the first metal layer, forming a second metal layer over the dielectric layer and then personalizing the second metal layer to define individual circuit wires and pads. Conventionally, this personalization of the second metal layer, as well as the first metal layer, comprises a photolithographic etching process. After the second metal layer is personalized, the photoresist is stripped.

Often, the first metal layer and second metal layer will each comprise multiple films or layers. For example, the first metal layer and the second metal layer may each comprise a copper layer with a top film of chromium. This chromium acts as a solder dam for solder bumps to be formed on exposed portions of the first metal layer and the second metal layer. Since the solder bumps must directly contact the copper layer, it is necessary to selectively etch the top chromium films from exposed portions of the first metal layer and the second metal layer. Conventionally, this etching of the chromium films is accomplished by applying a second photoresist layer, which after photolithographic processing, provides openings exposing the areas to be etched and the areas to be laser ablated (to provide vias). The photoresist openings with the vias formed allow the top chromium film of both conductive layers to be etched simultaneously, thereby exposing the underlying copper layers. In a second pass, the second photoresist is stripped from the structure and electrical testing is conducted.

The disadvantage with the above-outlined approach is that consecutive photoresist and wet etching steps occur, each occurrence of which involves a number of processing steps. Further, wet etching chemistry inherently has disposal costs associated therewith.

Thus, the present invention is directed towards providing an improved fabrication method and multilayer circuitized structure which is less complex and costly to manufacture.

DISCLOSURE OF THE INVENTION

Briefly summarized, the present invention comprises in a first aspect a method for fabricating a multilayered circuit which comprises: providing a substrate; forming a first patterned conductive layer over the substrate, the first patterned conductive layer having an open area therein; providing a dielectric layer on the first patterned conductive layer and into the open area of the first patterned conductive layer; providing a second patterned conductive layer on the first dielectric layer, the second patterned conductive layer having an open area exposing a portion of the first dielectric layer; providing a second dielectric layer over the second patterned conductive layer and the exposed portion of the first dielectric layer; and providing openings in the second dielectric layer and in both the second and first dielectric layers to expose selected portions of the second patterned conductive layer and the first patterned conductive layer, respectively.

In another aspect, the invention comprises a multilayered circuitized substrate which includes a dielectric substrate having a first conductive layer disposed thereon. The first conductive layer includes open areas therein through which the dielectric substrate is exposed. A first dielectric layer is blanketed over the first conductive layer including within the open areas of the first conductive layer. A second conductive layer is disposed above the first dielectric layer including the first dielectric layer located within the open areas of the first conductive layer. A second dielectric layer is positioned over the second conductive layer and a plurality of openings exist within the second and first dielectric layers exposing respective portions of the second and first conductive layers. The first conductive layer is substantially planar within a first plane, while the second conductive layer substantially occupies two planes other than the first plane of the first conductive layer. Numerous enhancements to each of the above-outlined aspects of the present invention are described and claimed herein.

A multilayered circuit fabrication approach in accordance to the present invention has numerous advantages over the conventional approach outlined initially herein. The present approach is less complex and less costly to implement than the conventional technique. Reduced cycle time results from the fewer process steps. Further, the present invention comprises to a greater extent a dry process, which has certain inherent advantages over the wet etching chemistry approach of the conventional technique. Process savings accrue from a reduction in chemical usage necessary for resist apply, develop and strip. A more robust product is also attained with a reduced susceptibility to surface contamination, loose metal flake shorting and handling damage.

Further, with the processing of the present invention there is potential extension of cost savings to subsequent processing through the elimination of follow-on encapsulation processes since the second metal layer is blanket covered by a second dielectric in accordance with the present invention. The multilayered circuitized substrate in accordance with the present invention advantageously has a reduced offset between the contact surfaces of the first metal layer and the second metal layer. This is accomplished through the selective removal of the first metal layer in areas underneath the contact points in the second metal layer. This reduction in distance between the contact surfaces facilitates subsequent simultaneous metal connect to the different surfaces.

BRIEF DESCRIPTION OF THE DRAWINGS

The subject matter which is regarded as the present invention is particularly pointed out and distinctly claimed in the concluding portion of the specification. The invention, however, both as to organization and method to practice, together with further objects and advantages thereof, may best be understood by reference to the following detailed description taken in conjunction with the accompanying drawings in which:

BEST MODE FOR CARRYING OUT THE INVENTION

Generally stated, this invention comprises a novel fabrication process for producing a multilayered circuit above a substrate, such as a ceramic substrate, semiconductor chip or a printed circuit board. The approach employs the simultaneous opening, e.g. via laser ablation, of openings to different conductive layers of the multilayer structure. Further, the multilayered structure is designed with offsets such that contact pads on a second conductive layer are recessed towards a first conductive layer, which facilitates subsequent simultaneous interconnect to the different conductive layers. These features of the present invention, as well as others, are explained below in detail with reference to formation of a multilayered circuitized substrate designed for connection to an integrated circuit chip through the use of flip-chip technology. This application of the present invention is provided by way of example only.

In accordance with the present invention, the conventional processing discussed initially herein is replaced subsequent to personalization of the second conductive layer and stripping of the photoresist used therein, by applying a second blanket dielectric layer over the second conductive layer. Laser ablation is then employed to form openings in the second dielectric layer to expose selected portions of the second conductive layer, and openings in the second dielectric layer and the first dielectric layer to expose selected portions of the first conductive layer. Once these openings are formed, the top chromium film of both the first conductive layer and the second conductive layer is etched from within the openings and electrical contacts are provided on the exposed portions of the first and second conductive layers. This process is described in detail below with reference to FIGS. 1–7.

Figure 1:
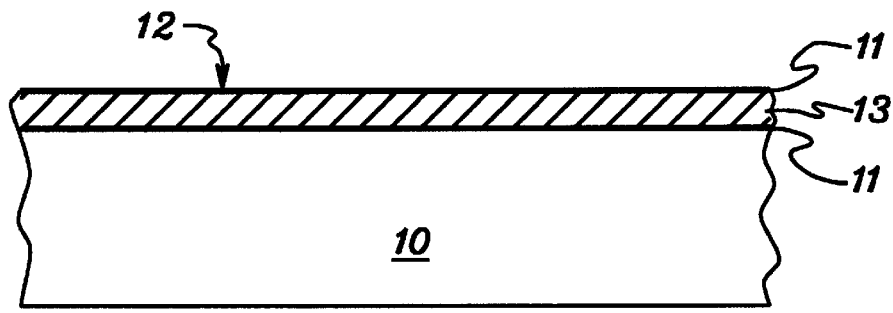
FIG. 1 is a cross-sectional view of an intermediate structure attained in accordance with the present invention wherein a substrate has a first conductive trilayer disposed thereon.

In FIG. 1, a substrate, such as a dielectric substrate comprising a ceramic or polyimide material, is provided above which a first conductive layer 12 has been formed. Should substrate 10 comprise a conductive material, then an isolation layer (not shown) would be needed between first conductive layer 12 and substrate 10. First conductive layer 12 is shown to comprise a "triplanar" or "trilayer" structure wherein a bottom conductive film 11 and top conductive film 11 sandwich a middle conductive layer 13. By way of example, top and bottom films 11 might each comprise a 1000 Angstrom thick chromium film, while middle conductive layer 13 might comprise a 4 micron thick copper layer. Chromium films 11 facilitate adhesion of the copper layer to the substrate and adhesion of subsequent layers to the first conductive layer. This triplanar structure is collectively referred to as the first conductive layer 12.

Figure 2:
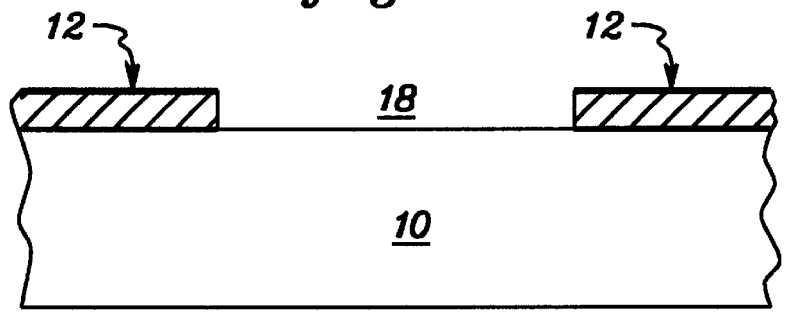
FIG. 2 is a cross-sectional view of the structure of FIG. 1 after patterning and selective removal of the first conductive trilayer.

In FIG. 2, layer 12 has been patterned and open area(s) 18 has been defined so that the substrate is exposed through the open area(s). First conductive layer 12 is patterned for selective removal in those areas where contact pads on a second conductive layer yet to be formed will be located. In essence, these open areas comprise "cutouts" under all contact sites of the second conductive layer, or third conductive layer, fourth conductive layer, etc. The open area 18 shown in FIG. 2 is representative of multiple open areas in the first conductive layer. Also, note that the sizing of the area is not necessarily to scale.

Figure 3:
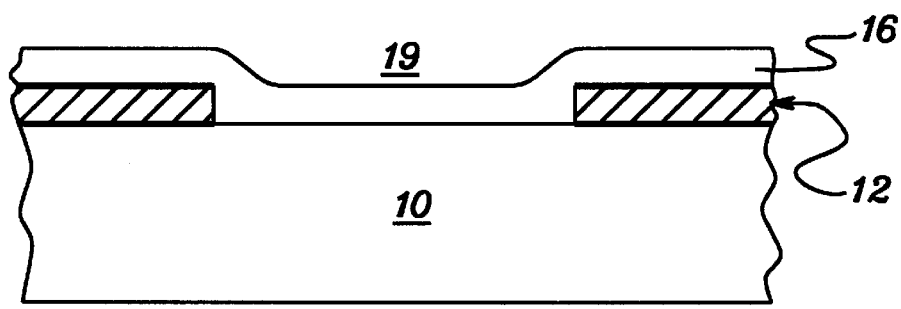
FIG. 3 is a cross-sectional view of the structure of FIG. 2 subsequent to blanket deposition of a dielectric layer over the structure.

Next, as shown in FIG. 3, a first dielectric layer 16 is blanket formed over the patterned first conductive layer 12. As one example, this first dielectric layer may comprise a polyimide 7–8 microns thick. The polyimide is preferably sprayed over the structure, however, lamination, roller coating or curtain coating, as well as other techniques, may be employed. Because first dielectric layer 16 is blanket deposited, recessed areas 19 will be formed in the dielectric material wherever there are open areas 18 (FIG. 2) in first conductive layer 12; i.e., assuming that the thickness of dielectric layer 16 is sufficiently small.

Figure 4:
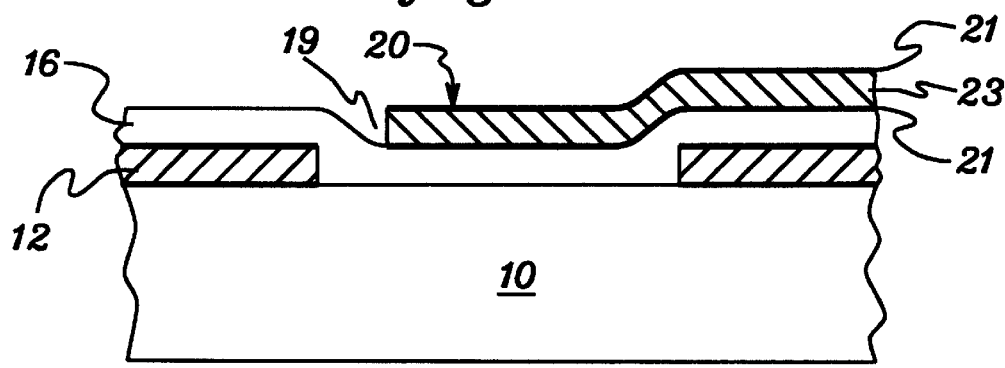
FIG. 4 is a cross-sectional view of the structure of FIG. 3 after formation of a second conductive trilayer over the blanket dielectric layer.

FIG. 4 depicts a second conductive layer 20 deposited and patterned to partially reside within recessed areas 19 of the multilayered circuit. Second conductive layer 20 again comprises a "triplanar" or "trilayer" structure wherein top and bottom films of a first conductive material, such as chromium, sandwich a second conductive material 23, for example, copper. Thicknesses may vary, however by way of example, top and bottom films 21 might comprise a chromium film in the range of 800–1200 Angstroms, while the thickness of the copper material 23 might be 8 microns.

As noted above, recessed areas 19 are formed in those locations where contact to the second metalization layer 20 is to occur. The result is that the second metalization layer resides in two planes, both of which are different from the plane within which the first conductive layer resides. A significant advantage of the present invention is reduction in the height differential of the contact surface of second conductive layer 20 to the contact surface of the first conductive layer 12 relative to the substrate. This facilitates simultaneous electrical connect to both conductive layers. Thus, by minimizing the difference between the upper surfaces of the first conductive layer and the second conductive layer, manufacturability is enhanced. Note that the present stacking concept can apply to any number of conductive layers, with two conductive layers being described herein by way of example only. As also shown in FIG. 4, the second conductive layer does not extend over portions of the first conductive layer where electrical connect is to be made. In this example, the left most portion of the first conductive layer is assumed to be predefined or targeted for electrical connection (see FIGS. 6 & 7).

Figure 5:
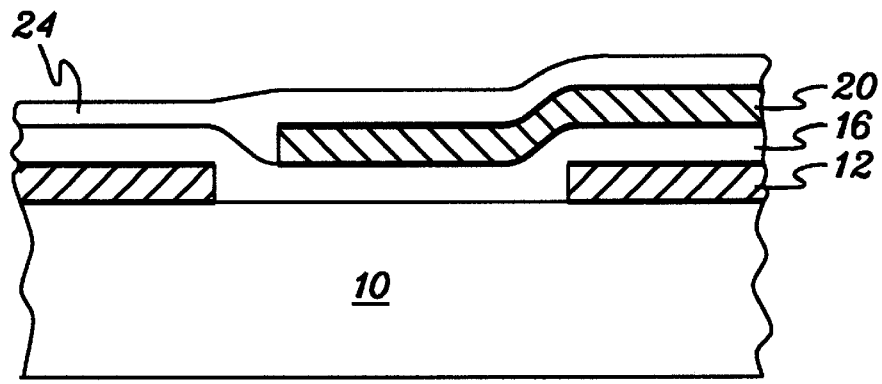
FIG. 5 is a cross-sectional view of the structure of FIG. 4 subsequent to formation of a second blanket dielectric layer.

Referring to FIG. 5, a second dielectric layer 24 is next blanket deposited over the structure to encapsulate the upper surface of the entire structure. This second dielectric layer may also comprise a spray applied polyimide. The thickness of the dielectric may vary, however, for consistency greater than 3 microns is believed preferable.

Figure 6:
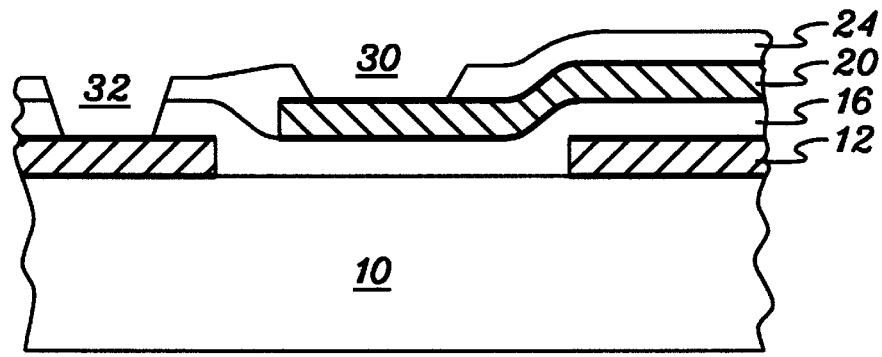
FIG. 6 is a cross-sectional view of the structure of FIG. 5 after openings have been formed in the second dielectric layer and in both the second dielectric layer and the first dielectric layer to expose selected portions of the second conductive trilayer and the first conductive trilayer, respectively.
Figure 7:
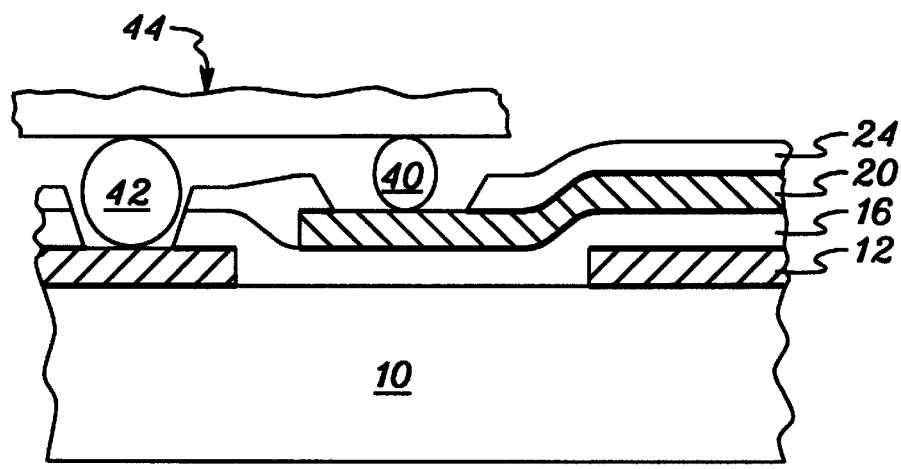
FIG. 7 is a cross-sectional view of the structure of FIG. 6 after formation of solder bumps and attachment of an integrated circuit chip to the exposed portions of the first conductive trilayer and the second conductive trilayer.

In FIG. 6, contact openings 30 & 32 are next simultaneously created by laser ablating the second dielectric layer, and both the second dielectric layer and the first dielectric layer, respectively, in selected locations. These openings expose desired portions of the second conductive layer and the first conductive layer predefined to comprise contact areas to the respective layers. Assuming solder bump connect is employed, then the top conductive film 21 (FIG. 4) of the second conductive layer and the top conductive film 11 (FIG. 1) of the first conductive layer are etched to expose the respective copper conductors. This etching of the top conductive films can occur simultaneously in both the second conductive layer and the first conductive layer. As noted initially, the chromium films operate as a solder dam to prevent solder from wicking down the first conductive layer and the second conductive layer. This function occurs during the formation of solder bumps 40 & 42 in openings 30 & 32 after removal of the top chromium films exposed within the openings. In practice, the width of contact areas exposed at both the first conductive layer and the second conductive layer would be substantially greater than the depth of the openings to the contact areas. An integrated circuit chip 44, or other structure such as a printed circuit board, is then electrically connected via the solder bumps 40 & 42 to the multilayer circuitry.

Those skilled in the art will note that a multilayer circuit structure in accordance with the present invention contains a second dielectric layer, i.e., second polyimide layer, which effectively encapsulates the entire second conductive layer and any exposed portion of the first dielectric layer, with the exception of the laser ablation sites, i.e., those sites where electrical contact is made to the first conductive layer or the second conductive layer. Further, the "cutouts" under all contact areas of the second conductive layer facilitate subsequent simultaneous connection of the conductive layers to another structure by reducing the height difference between the contact plane of the first conductive layer, or M1 layer, and the second conductive layer, or M2 layer. Note that although only two conductive layers have been described herein, that the present invention is also applicable to n conductive layers, wherein n≧2.

A multilayered circuit fabrication approach in accordance to the present invention has numerous advantages. The present approach is less complex and less costly to implement than the conventional technique. Reduced cycle time results from the fewer process steps. Further, the present invention comprises to a greater extent a dry process, which has certain inherent advantages over the wet etching chemistry approach of the conventional technique. Process savings accrue from a reduction in chemical usage necessary for resist apply, develop and strip. A more robust product is also attained with a reduced susceptibility to surface contamination, loose metal flake shorting and handling damage.

Further, with the processing of the present invention there is potential extension of cost savings to subsequent processing through the elimination of follow-on encapsulation processes since the second metal layer is blanket covered by a second dielectric in accordance with the present invention. The multilayered circuitized substrate in accordance with the present invention advantageously has a reduced offset between the contact surfaces of the first metal layer and the second metal layer. This is accomplished through the selective removal of the first metal layer in areas underneath the contact points in the second metal layer. This reduction in distance between the contact surfaces facilitates subsequent simultaneous metal connect to the different surfaces.

Although a specific embodiment of the present invention has been illustrated in the accompanying drawings and described in detail in the foregoing description, it will be understood that the invention is not limited to the particular embodiment described herein, but is capable of numerous rearrangements, modifications and substitutions without departing from the scope of the invention. The following claims are intended to encompass all such modifications.

We claim:

1. A method for fabricating a multilayered circuit comprising:
   (a) providing a substrate;
   (b) forming a first patterned conductive layer over the substrate, said first patterned conductive layer having an open area therein;
   (c) providing a first dielectric layer on the first patterned conductive layer and into the open area of the first patterned conductive layer;
   (d) providing a second patterned conductive layer on the first dielectric layer, said second patterned conductive layer having an open area exposing a portion of said first dielectric layer;
   (e) providing a second dielectric layer over said second patterned conductive layer and said exposed portion of said first dielectric layer; and
   (f) providing openings in said second dielectric layer and in both said second and first dielectric layers to expose selected portions of said second patterned conductive layer and said first patterned conductive layer, respectively.

2. The method of claim 1, wherein said providing step (c) comprises providing a first blanket dielectric layer over said first patterned conductive layer having said open area such that a recessed area in said first blanket dielectric layer is defined, and wherein said providing step (d) comprises providing said second patterned conductive layer over said first blanket dielectric layer so that a contact pad is defined and such that a portion of said second patterned conductive layer resides within said recessed area, said portion of said second patterned conductive layer residing within said recessed area including said contact pad, and wherein said providing step (f) includes providing an opening in said second dielectric layer to expose said contact pad.

3. The method of claim 1, wherein said providing step (a) comprises providing a dielectric substrate, and wherein said providing step (b) comprises providing a first conductive layer directly on the dielectric substrate such that said open area of said first patterned conductive layer exposes said dielectric substrate.

4. The method of claim 1, wherein said providing step (f) comprises simultaneously providing said openings through said second dielectric layer and through both said second and first dielectric layers to expose said respective selected portions of said second patterned conductive layer and said first patterned conductive layer.

5. The method of claim 1, wherein said forming step (b) comprises forming a first triplanar conductive layer over the substrate, said first triplanar conductive layer having a top conductive film and a bottom conductive film each formed of a first conductive material, and a middle conductive layer formed of a second conductive material, said middle conductive layer being sandwiched between said top and bottom conductive films, and wherein said providing step (d) comprises providing a second triplanar conductive layer on the first dielectric layer, said second triplanar conductive layer having a top conductive film and a bottom conductive film each formed of said first conductive material and a middle conductive layer formed of said second conductive material and sandwiched between said top and bottom conductive films of said second triplanar conductive layer.

6. The method of claim 5, further comprising removing exposed portions of said top conductive film of said first triplanar conductive layer and said top conductive film of said second triplanar conductive layer after said openings providing step (f).

7. The method of claim 6, further comprising forming electrical contacts over the exposed portions of the middle conductive layer of said first triplanar conductive layer and the exposed portions of the middle conductive layer of said second triplanar conductive layer.

8. The method of claim 7, further comprising electrically connecting an integrated circuit chip to the electrical contacts formed over the exposed portions of the middle conductive layers of the first triplanar conductive layer and the second triplanar conductive layer.

9. The method of claim 6, wherein said first conductive material comprises chromium and said second conductive material comprises copper.

10. The method of claim 1, further comprising prior to said providing step (f):
 (i) providing an additional patterned conductive layer on the second dielectric layer, said additional patterned conductive layer having an open area therein;
 (ii) providing an additional dielectric layer over said additional patterned conductive layer and said open area therein; and
 (iii) repeating said steps (i) & (ii) n times, wherein n≧1, and wherein said providing step (f) comprises simultaneously providing openings in each dielectric layer to expose selected portions of each patterned conductive layer.

11. The method of claim 1, wherein said substrate of said providing step (a) comprises a ceramic substrate, a semiconductor chip, or a printed circuit board.

12. The method of claim 1, wherein said providing step (d) comprises providing said second patterned conductive layer with multiple contact pads, each contact pad of said multiple contact pads being disposed above said open area in said first conductive layer such that said multiple contact pads are recessed towards said first patterned conductive layer and said second patterned conductive layer occupies two planes above said substrate.

13. A multilayered circuitized substrate comprising:
 a dielectric substrate;
 a first conductive layer on said dielectric substrate and including open areas therein exposing said dielectric substrate;
 a first dielectric layer above the first conductive layer and within said open areas of said first conductive layer;
 a second conductive layer above the first dielectric layer including said first dielectric layer located within said open areas of said first conductive layer, said second conductive layer having open areas exposing portions of said first dielectric layer;
 a second dielectric layer over the second conductive layer and the exposed portions of said first dielectric layer; and
 a plurality of openings within said second and first dielectric layers exposing portions of said second and first conductive layers, said first conductive layer being substantially planar within a first plane, said second conductive layer substantially occupying two planes other than the first plane of said first conductive layer.

14. The multilayered circuitized substrate of claim 13, wherein said exposed portions of said second and first conductive layers comprise contact pads.

15. The multilayered circuitized substrate of claim 14, wherein said contact pads in said second conductive layer are disposed above said open areas in said first conductive layer, such that said contact pads of said second conductive layer are recessed towards said first conductive layer.

16. The multilayered circuitized substrate of claim 14, wherein said first conductive layer comprises a first conductive trilayer having top and bottom conductive films of a first material and a middle conductive layer of a second material, and wherein said second conductive layer comprises a second conductive trilayer also having top and bottom conductive films of said first conductive material and a middle conductive layer of said second conductive material.

17. The multilayered circuitized substrate of claim 16, wherein said first conductive material comprises chromium and said second conductive material comprises copper.

18. The multilayered circuitized substrate of claim 16, further comprising electrical contacts coupled to said contact pads, said electrical contacts facilitating electrical connection of an integrated circuit chip to said multilayered circuitized substrate.

19. The multilayered circuitized substrate of claim 13, wherein said first dielectric layer and said second dielectric layer each comprise polyimide layers.

20. The multilayered circuitized substrate of claim 13, wherein said first conductive layer comprises a ground plane and said second conductive layer comprises a signal plane.

* * * * *